(12) United States Patent
Janvrin et al.

(10) Patent No.: US 10,804,594 B2
(45) Date of Patent: Oct. 13, 2020

(54) SINGLE-FACE ANTENNA MODULE COMPRISING CMS DEVICE

(71) Applicant: GEMALTO SA, Meudon (FR)

(72) Inventors: Remy Janvrin, Gemenos (FR); Line Degeilh, Gemenos (FR); Lucile Dossetto, Gemenos (FR); Stéphane Ottobon, Gemenos (FR)

(73) Assignee: THALES DIS FRANCE SA, Meudon (FR)

( * ) Notice: Subject to any disclaimer, the term of this patent is extended or adjusted under 35 U.S.C. 154(b) by 0 days.

(21) Appl. No.: 15/780,465

(22) PCT Filed: Dec. 13, 2016

(86) PCT No.: PCT/EP2016/080830
§ 371 (c)(1),
(2) Date: May 31, 2018

(87) PCT Pub. No.: WO2017/102749
PCT Pub. Date: Jun. 22, 2017

(65) Prior Publication Data
US 2018/0351233 A1 Dec. 6, 2018

(30) Foreign Application Priority Data

Dec. 15, 2015 (EP) .................................. 15307015

(51) Int. Cl.
*H01Q 1/22* (2006.01)
*H01Q 7/00* (2006.01)
(52) U.S. Cl.
CPC ......... *H01Q 1/2283* (2013.01); *H01Q 1/2208* (2013.01); *H01Q 1/2225* (2013.01); *H01L 2224/48091* (2013.01)

(58) Field of Classification Search
CPC ...... H01Q 1/22; H01Q 1/2225; H01Q 1/2283; H01Q 7/00
See application file for complete search history.

(56) References Cited

U.S. PATENT DOCUMENTS 6,459,588 B1 * 10/2002 Morizumi ........ G06K 19/07749
235/492
6,522,308 B1 2/2003 Mathieu
(Continued)

FOREIGN PATENT DOCUMENTS

| EP | 2 669 852 A1 | 12/2013 |
| FR | 2 743 649 B1 | 4/1998 |

(Continued)

OTHER PUBLICATIONS

International Search Report (PCT/ISA/210) dated Mar. 7, 2017, by the European Patent Office as the International Searching Authority for International Application No. PCT/EP2016/080830.
(Continued)

*Primary Examiner* — Hoang V Nguyen
(74) *Attorney, Agent, or Firm* — Buchanan Ingersoll & Rooney PC

(57) ABSTRACT

The invention relates to a module with integrated circuit chip, comprising an insulating substrate, metallisations comprising conductive tracks produced on one side of the substrate, forming an antenna and comprising two connection ends, and a coating area or location of the radiofrequency integrated circuit chip and of a device in the form of a surface-mounted device, the radiofrequency integrated circuit chip and the device being disposed on the same face of the substrate and connected to the antenna. The metallisations are on a single same side of the insulating substrate, the connection being made by means of perforations through the insulating film or directly on the surface metallisations.

19 Claims, 3 Drawing Sheets

(56) References Cited

U.S. PATENT DOCUMENTS

| | | |
|---|---|---|
| 2002/0089049 A1 | 7/2002 | Leduc et al. |
| 2003/0184495 A1 | 10/2003 | Tomon |
| 2010/0051703 A1 | 3/2010 | Kobae |
| 2015/0269474 A1* | 9/2015 | Finn ................ G06K 19/07718 235/492 |
| 2015/0278675 A1* | 10/2015 | Finn ................ G06K 19/07783 235/492 |

FOREIGN PATENT DOCUMENTS

| | | |
|---|---|---|
| FR | 2 803 439 A1 | 7/2001 |
| JP | 2011-135307 A | 7/2011 |
| WO | WO 01/84667 A1 | 11/2001 |

OTHER PUBLICATIONS

Written Opinion (PCT/ISA/237) dated Mar. 7, 2017, by the European Patent Office as the International Searching Authority for International Application No. PCT/EP2016/080830.

* cited by examiner

Section B-B

Section B-B

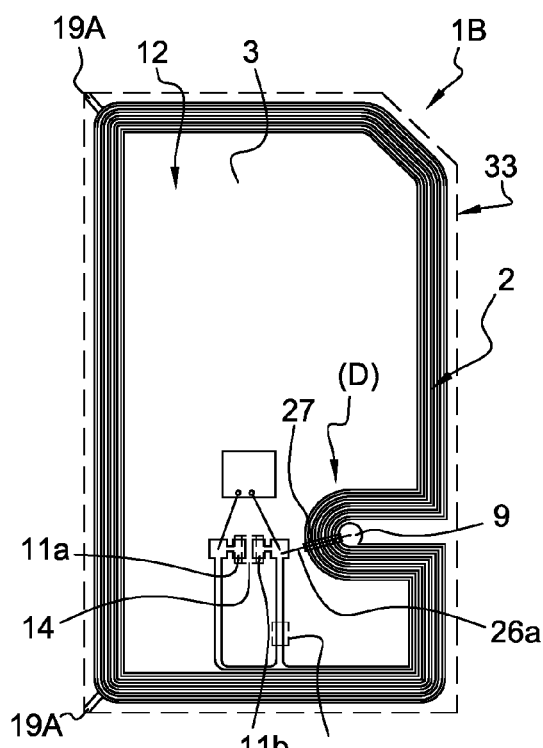
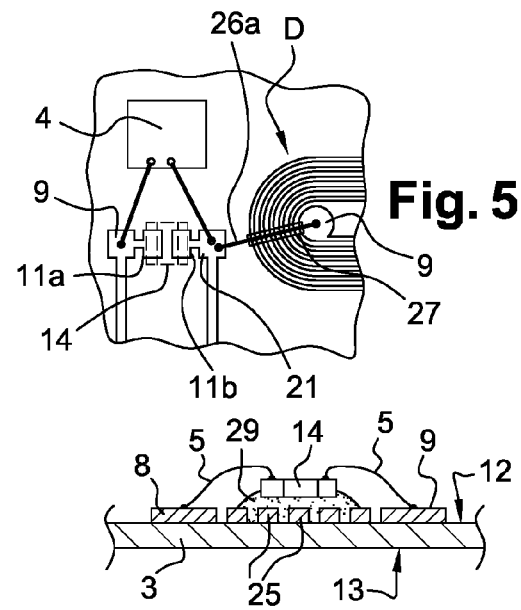
Fig. 5B
Fig. 5A
Fig. 5C
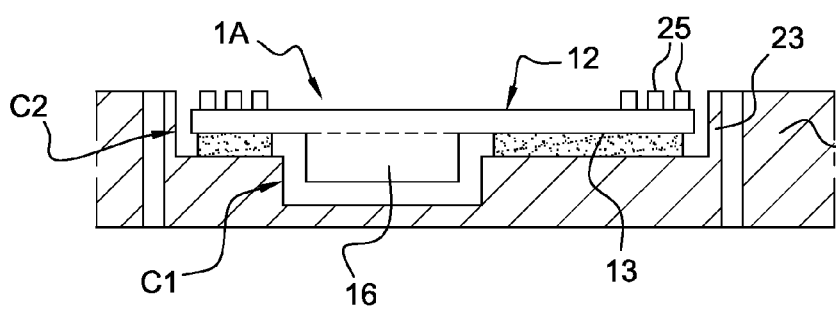
Fig. 7
Section A-A
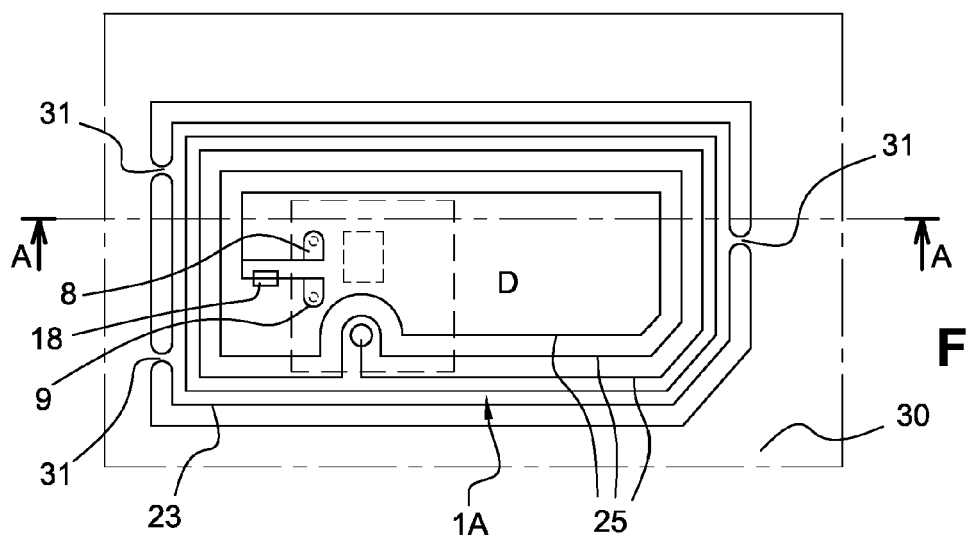
Fig. 6

SINGLE-FACE ANTENNA MODULE COMPRISING CMS DEVICE

FIELD OF THE INVENTION

The invention relates to an electronic module comprising an integrated-circuit chip connected to a radiofrequency antenna and a surface-mounted device (SMD), for example a capacitance.

The invention can relate, in particular, to the field of electronic substrates such as contact and/or contactless smart cards or hybrid cards, radiofrequency identification (RFID) labels or tags, radiofrequency transponders and inserts (or inlays) integrating or constituting such a module. Such electronic substrates can be in accordance with the ISO/IEC 14443 or ISO 78016 standards.

The invention is preferably used by being inserted in particular into portable electronic devices such as bracelets, watches, key fobs, garments, etc. for performing radiofrequency payment, identification and authentication transactions.

PRIOR ART

It is known to manufacture a smart-card module by the steps corresponding to the preamble of claim 1. Such antenna modules are described in patent FR 2,743,649 B1. According to the disclosed variants, the chip can be placed astride the turns of an antenna and at the periphery so as to allow a connection to the chip via soldered wire.

In another variant, the chip is placed at the centre of the module, the antenna includes one connection end located at the periphery of the turns, and the chip is connected to said end by soldered wire straddling the turns.

In another variant, the module includes a conductive bridge made on the surface opposite that carrying the turns, and conductive vias pass through the substrate to connect the conductive bridge to the antenna.

Patent application EP 2,669,852 describes a single-face integrated-circuit module with a deflection of the peripheral turns of an antenna towards the centre to allow a chip to be mounted astride the turns and to connect an outer terminal of the antenna directly by soldered wire.

Existing antenna modules with contactless chip are of the double-face type and comprise metallised conductive vias through the base film of the module. In these modules, it is currently proposed in the market to connect an integrated-circuit (IC) chip and a capacitor to the etched antenna in order to adjust the resonant frequency of the radiofrequency communication transponder thus formed. These modules are complicated to produce and expensive.

Document 2012 0050130 describes a radiofrequency communication device comprising an insulating substrate carrying an antenna connected to a chip and a capacitor. The capacitor is obtained by two conductive plates arranged on either side of the substrate.

Technical Problem

The above modules do not make it possible to optimise the radiofrequency performance at the best cost.

The aim of the invention is to solve the problems above and, in particular, to obtain a high-performance radiofrequency module that is more straightforward and less expensive to manufacture.

SUMMARY OF THE INVENTION

The invention consists in, first adopting a single-face antenna-module substrate, second providing a capacitor in the form of a passive device or integrated circuit, and third configuring said single-face substrate so as to allow surface mounting (SMD) of a device (resistance capacitor, coil or other) in the form of a passive device or integrated-circuit chip and the connection thereof to the antenna. Finally, and fourth, the invention consists in using a smart-card type of production process to ensure mechanical reliability and amortise the manufacturing price.

The configuration of the module should allow easy production on industrial scale using conventional technologies in the smart-card industry.

Thanks to the design of the module, it is possible to do away with conductive vias through the insulating film, with redirection tracks on one face of the substrate opposite that supporting the antenna.

It is possible to protect the connections of the chip to the antenna in a central or median coating area while having the antenna on a single face.

Production is also simplified with single-face etching while the chip is in a central or median position, allowing an optimal surface for gluing the module into the card, where applicable.

The invention thus relates to a module with a radiofrequency integrated-circuit chip module, comprising
- an insulating substrate, metallisations comprising conductive tracks, made on the same side of the substrate and forming an antenna with two connection terminals,
- at least one area on the base film for coating or placing the radiofrequency integrated-circuit chip and a capacitance in the form of a surface-mounted device, the radiofrequency integrated-circuit chip and the device being arranged on the same single face of the substrate and connected to the antenna, characterised in that the conductive tracks are on the same single side of the base film, the connection being made via perforations through the insulating film or directly on the surface tracks of the insulating substrate.

According to other features of the module:
- The module comprises a spiral including antenna turns at the periphery of the substrate, the chip and the device being arranged inside (or above) the spiral; it includes a metallised interconnection terminal inside the spiral, said metallised interconnection terminal being connected to the antenna via an electrical connection in the sectioned or un-short-circuited state;
- Said sectioned or un-short-circuited state results from one operation among a mechanical or laser ablation, an isolated perforation of the substrate (or base film) and said link, a mechanical abrasion, a punching (or even a chemical etching);
- The chip is connected to the antenna via perforations through the insulating film;
- The chip and the device are connected to the same pair of interconnection terminals arranged inside the antenna in spiral form;
- The module can optimally comprise a deflection of the turns, said deflection extending from the periphery of the base film towards the inside of the spiral;
- The device (14) can be a capacitance;
- The chip and the device (in particular a capacitor) are coated with an insulating protective or coating material.

The invention also relates to a device such as a smart card including the module above. It can comprise a body with a cavity emerging onto the surface and said module inset and secured in the cavity.

Thus, the invention makes it possible inexpensively to manufacture a contactless smart card using technology to manufacture mini-SIM cards having good radiofrequency performance. The devices and their connections are protected mechanically since they are coated with insulating resin and the module is inset in a card body cavity like a smart-card module, but preferably with antenna dimensions covering around twice the dimensions of the smart-card module in ISO 7816 format.

The contactless card in mini-SIM format can then be detached from its mounting thanks to a scoring made around it. Then, the contactless card can be slid into a bracelet or a watch (or any portable object) in order to conduct transactions, in particular such as banking, payment, identification or authentication.

BRIEF DESCRIPTION OF THE FIGURES

FIGS. 5A, 5B and 5C show a radiofrequency chip module according to a second embodiment of the invention;

FIGS. 6 and 7 respectively show a radiofrequency chip module inset in a device body and a section according to A-A of FIG. 6.

DESCRIPTION

Figure 1:
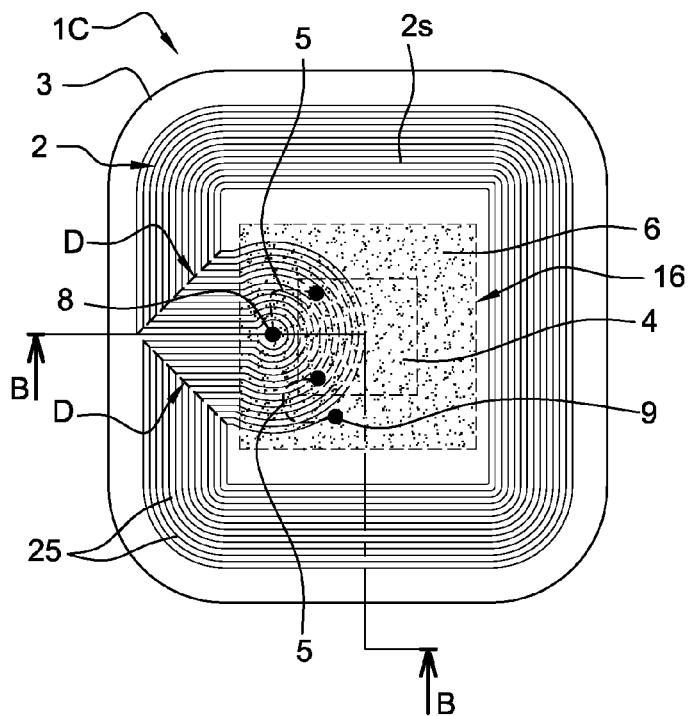
FIGS. 1-2 show a radiofrequency smart-card module of the prior art.

In the drawings, the same references indicate identical or similar elements.

Figure 2:
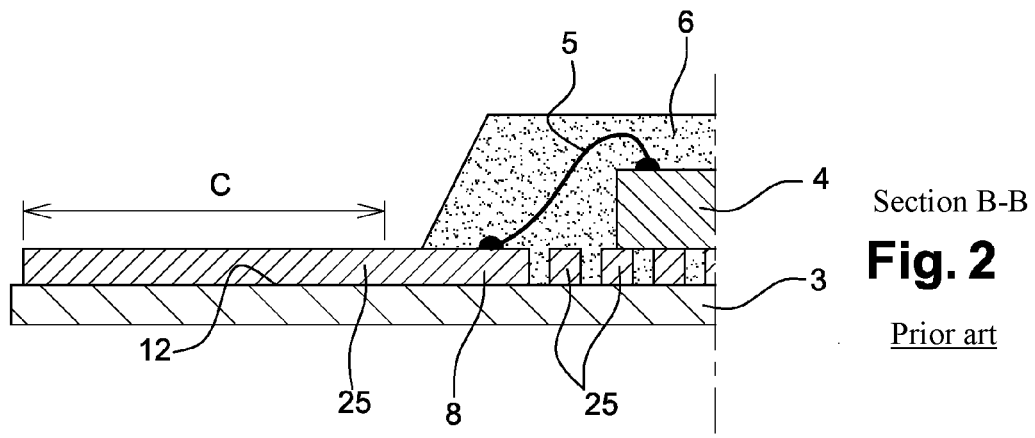

FIGS. 1 and 2 show an integrated-circuit (IC) module of the prior art (patent application EP 2,669,852). It comprises an insulating substrate 3, conductive tracks 2, made on the same single side of the substrate 12, forming an antenna 2 and including two connection ends 8, 9, an area for coating or placing 16 the radiofrequency integrated-circuit chip; the radiofrequency integrated-circuit chip is arranged on the same single face 12 of the substrate 3 and is connected to the antenna; the chip is mounted partially astride a deflection (D) of the peripheral turns 25 towards a central region of the module.

Figure 3:
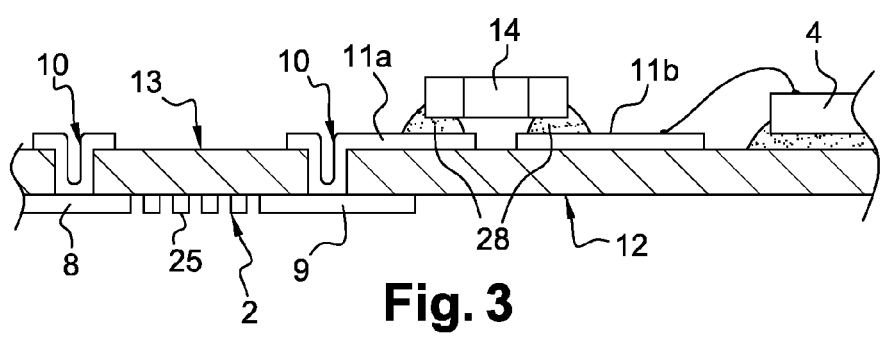
FIG. 3 shows a current prior art module of the double-face type with a radiofrequency chip and a capacitance on the same single face.

FIG. 3 shows an existing embodiment; it comprises a double-face base film (or substrate) 3 including metallisations etched onto each face of the insulating base film. The spiral antenna 2 and electrically conductive pads or terminals 8, 9 are produced on a first face 12. And second etched metallisations including interconnection pads 11a, 11b for connecting the integrated-circuit chip 4 and an SMD (surface-mounted device) 14 are located on a second face 13 opposite the first face. The SMD device can be, for example, a capacitance in the form of a passive device, the capacitance being made up of multiple layers of dielectric ceramics. It is mounted on the surface of the substrate 3 opposite a capacitor that is made up of capacitor plates obtained in particular by etching on a substrate. The capacitor described by the invention has the advantage of being compact. It can have high capacitance in a volume or bulk that is substantially smaller than or of the same order of magnitude as that of the radiofrequency chip.

Thus, it is possible to group the components together for possible insetting. It is optionally possible to perform a coating of the assembly.

The chip and the device are mounted on the same side of a second face 13 of the insulating substrate and connect terminals 8, 9 of the antenna 2 by means of conductive vias 10 in blind perforations of the base film. The vias 10 connect terminals 8, 9 of the antenna produced on the first face.

Figure 4A:
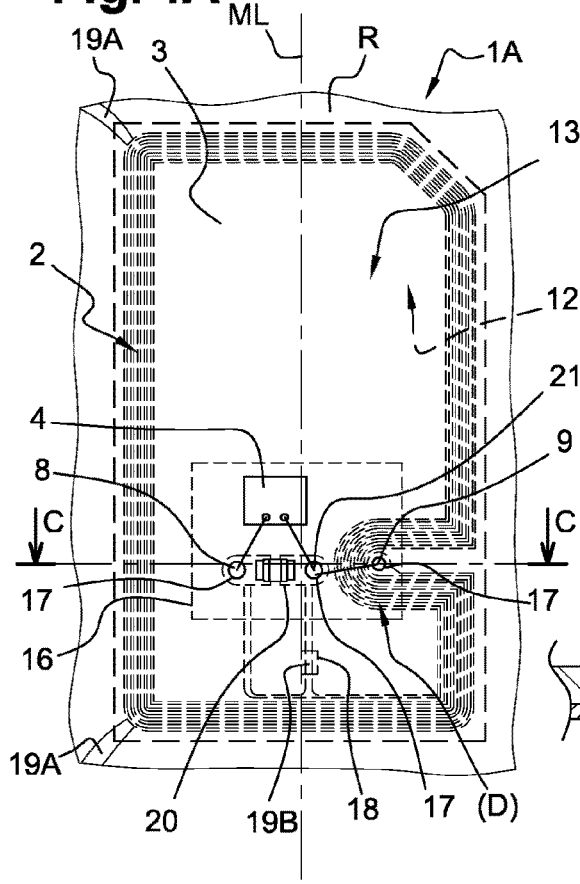
FIGS. 4A, 4B, 4C, 4D, 4E and 4F show a radiofrequency chip module according to a first embodiment of the invention.

In FIG. 4A, a module 1A with an integrated-circuit chip 4 according to a first embodiment of the invention comprises, as above, an insulating substrate 3, conductive tracks 25, made on the same single side of the substrate (12); these tracks form an antenna 2 with turns 25 and comprise two connection ends or terminals 8, 9.

This mode provides an area 16 for coating or placing the radiofrequency integrated-circuit chip and the device 14, in the form of a device (such as an SMD), in particular here a capacitance; the assembly 4, 14, 5 is substantially centred on a longitudinal perpendicular bisector ML of the module (to allow resin coating and insetting in a card body); the coating area 16 is covered with a coating material 6 protecting these two devices 4, 14 as well as the electrical connections 5 thereof. These connections can be of any known type.

The radiofrequency integrated-circuit chip 4 and the device 14 are arranged on the same first face 12 of the substrate and connected to the antenna 2.

According to a feature of this first mode, the metallisations 8, 9 are made on the same single side of the base film. The connexion 5 linking the components is made here through perforations 17 (non-metallised) of the insulating substrate 3.

The antenna here is made by etching metal previously adhered to a substrate presented in a ribbon and including connection wells or perforations.

The antenna 2 includes current inlet tracks 19A in order to produce electrical continuity of the metallisations during etching. These tracks 19A can be sectioned subsequently at the same time as the module is removed from the substrate by punching along the dotted periphery 33 thereof. Alternatively, these tracks 19A can be sectioned at the same time as the other tracks to be un-short-circuited 19B, located outside the module (conventional un-short-circuiting of the films of smart-card modules).

The antenna comprises a metallised redirection terminal inside the turns 25. This metallised redirection terminal is linked to the antenna initially by an electrical connection 19B to allow a current inlet. These inlet tracks 19A, 19B can then be removed, in particular by punching 18 or by laser, in particular during the removal of the module 1A from the ribbon R for transporting same.

The module is provided in a final version with the electrical current inlet connections 19 in the sectioned or un-short-circuited state. The sectioned or un-short-circuited state of the electrical connection 19 can result from an operation among a mechanical or laser ablation, an isolated perforation of the base film and the link, a mechanical abrasion, or a punching.

The antenna turns 25 here extend at the periphery of the base film 3, and the chip 4 and the device (in particular capacitive) 14 are arranged inside the spiral formed by the turns 25.

In a preferred application, the module 1A (FIG. 4A) is intended for performing authentications and financial transactions, bank transactions and payments, and must be compact, such as in the format of a mini-SIM card.

In order to ensure good communication, the turns 25 preferably extend at the periphery of the module so as to have a larger coupling surface over a minimum surface.

The components 4, 14 are placed substantially on a longitudinal perpendicular bisector ML and substantially centred on the module in order to allow coating of the components and insetting of the module into a smart-card body, substantially like mini-SIM cards in 2FF format.

It can be seen that the chip 4 and the device 14 are connected to the same pair of interconnection terminals 8, 9 arranged inside the antenna spiral 2. Alternatively, the antenna can be in any form, such as a UHF-type antenna.

It can be seen that the module includes an outer terminal 9 of the antenna brought close to the interconnection metallisation 21 (or redirection terminal) via a deflection D of the turns; the deflection D forms a loop that extends from the periphery of the base film to a median position inside the spiral (actually towards the coating or placement area of the devices 16); the deflection "D" also extends to the metallised interconnection terminal 21 (or redirection terminal).

Figure 4B:
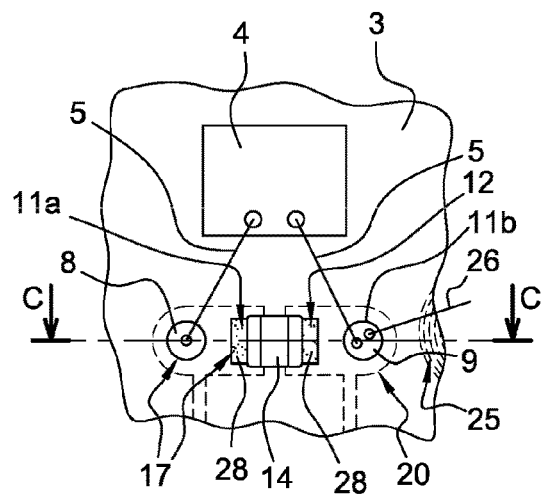

FIG. 4B shows an enlargement of a portion of FIG. 4A centred around the connections of the chip 4 and the capacitance 14.

The capacitance 14 and the radiofrequency chip 4 are arranged on one face 13 of the insulating substrate 3 and connected to the terminals (8, 9 via 21) of the antenna located on the face 12 of the substrate 3 opposite the face 13. The chip 4 is connected by soldered wire 5 through wells 17, and the capacitance is connected by conductive glue 28 through other wells 17.

Figure 4C:
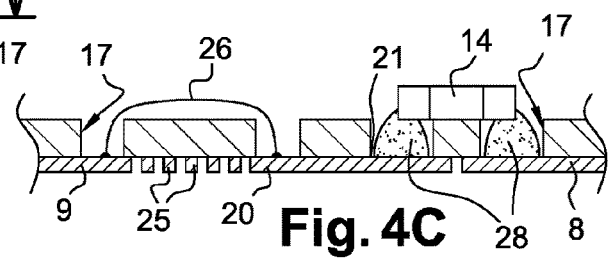

FIG. 4C is an approximate cross-section along C-C of FIG. 4B. The capacitance rests on the substrate 3 and the connection ends of the capacitance are above perforations 17 or recesses filled with conductive glue to electrically connect the capacitance to the antenna. The capacitance overhangs the corresponding wells 17.

Figure 4D:
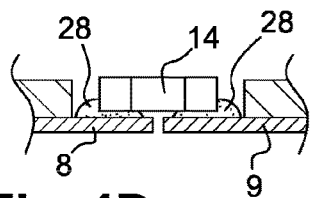

FIG. 4D shows a connection variant of the capacitance 14. It can be connected to the antenna terminals 8, 9 by being arranged in a window or cavity provided in the insulating substrate 3 according to a configuration of the embodiment of FIG. 4A. The advantage is that of reducing the overall thickness of the module. Here, the capacitance is connected using conductive glue 28. Instead of being astride two wells 17 on the substrate, the capacitance is at the bottom of a well 17.

Figure 4E:
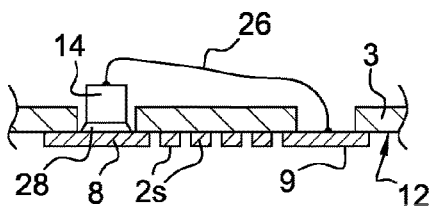
Figure 4F:
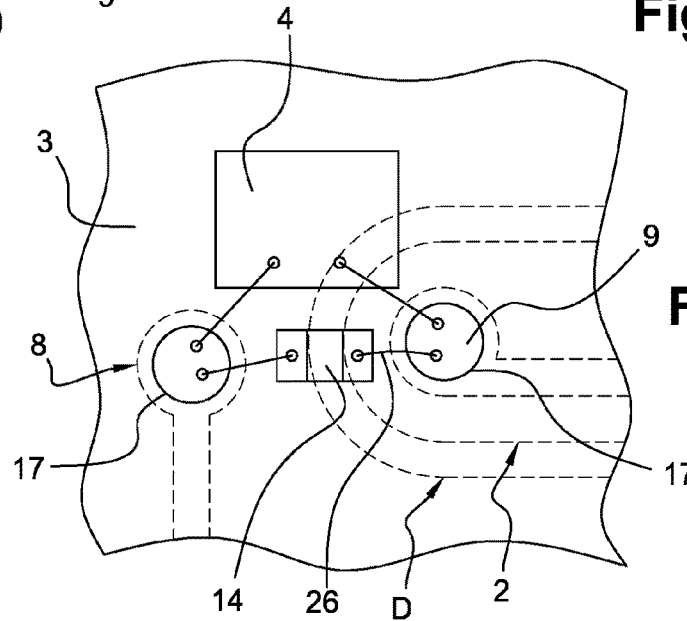

FIG. 4F shows a connection variant of the devices according to a configuration of the first embodiment. This variant differs from the embodiment of FIG. 4A in that the chip 4 and the capacitance 14 are directly connected by one side to the pad 9 and by the other side to the pad 8. This embodiment has the advantage of being compact for modules that have little space. Alternatively, the antenna 25 is arranged on the same side of the substrate 3 as the chip. The chip (or the device) can be mounted astride turns.

FIG. 4E shows a connection variant of FIG. 4D. It differs in that the capacitance 14 is adhered to the bottom of a well 17 and connected to an antenna terminal 8 by conductive glue 28, the capacitance being at least partially accommodated in the opening or perforation or well. The capacitance here comprises connection areas at the opposing ends thereof. The other end is connected directly by soldered wire 5 to the second antenna terminal 9.

The advantage here is that of compensating for the height of the capacitance and having a compact configuration of the components. The chip 4 can also be arranged in a cavity with matching dimensions.

The module thus produced can be cut out at the periphery 33 (dotted) thereof in order to remove it from a base film presented in particular in a strip of a coil "R".

FIG. 5A shows a second embodiment of the invention. It differs mainly from the embodiment of FIG. 4A in that the antenna is arranged on the same side 13 of the substrate as that carrying the devices 4, 14: Thus, the connection wells 17 are avoided and the antenna is protected against the outside of the module since it is contained in the cavity C2.

FIG. 5B shows an enlargement of a portion of the FIG. 5A centred on devices and the connections thereof. The chip 4 is connected to an antenna terminal and a redirection terminal 21. The terminal 21 is connected to the antenna terminal 9 via an electrical connection 26a or printed on an insulating bridge 27 which in turn is printed on turns 25 of the antenna deflection "D". Preferably, the insulating bridge is not essential, since the connection is made by soldered wire and extends over the turns of the antenna, in particular at the deflection (if one is present).

The capacitance 14 is connected to the terminals or pads 11, 12 thereof, respectively linked to the terminals 8 and 21 as in FIG. 4A with conductive glue 28. Alternatively, the capacitance 14 can be connected by soldered wire 5 to these terminals 11, 12.

This mode is advantageous in that it does not require any perforation, other than the un-short-circuiting 18.

FIG. 5C shows an arrangement and an electrical connection of the capacitance 14 which can suit one of the previously described embodiments. In this arrangement, the antenna 2 and the components 4, 14 are on the same side of the substrate. The capacitance 14 is secured astride the turns 25 of the antenna 2 using insulating glue 29. The capacitance is connected to the antenna terminals 8 and 9 by soldered wires straddling the turns 25.

FIG. 7 shows a device with a main body 30 comprising the module 1A, 1B.

In the example, the device 30 is a radiofrequency transponder in the form of a smart card. However, the module 1A, 1B can be inserted into various mountings or bodies of any product such as a garment, bracelet, watch, belt, etc.

In the example, the device 30 comprises a mini body 23 with a cavity C having two stages C1, C2, opening onto the surface and the module 1A is inset and secured in the cavity.

The module 1A is actually inset in a body 23 of a mini card in mini-SIM format (2FF: 25×15 mm). This mini-body 22 is, in turn, detachable in a known manner by breakable straps 31 to a main body 30 of a smart card 30. Where appropriate, other smaller formats—3FF and 4FF—are covered by the invention.

Thus, the invention makes it possible to use mini-SIM smart card technology for manufacturing, inexpensively and with good range, an inexpensive radiofrequency transponder provided with a single-face film.

The device or module can be in different chip-card formats, including 4FF format.

In every embodiment, the capacitance of the radiofrequency transponder can have a value higher than or equal to around 25 pF or 35 pF, in particular for a tuning frequency of 13.56 MHz.

The capacitance can, alternatively, be higher than 50 or 70 pico (p) farad in possible applications that the invention might cover.

The invention claimed is:
1. A smart card module with an integrated-circuit chip, comprising:
    an insulating substrate,
    metallisations comprising conductive tracks, made on the same single side of the substrate, forming an antenna and comprising two connection ends,
    an area for coating or placing the radiofrequency integrated-circuit chip and a device in the form of a surface-mounted device, the radiofrequency integrated-circuit chip and the device being arranged on the same single face of the substrate, without metallisations between the radiofrequency integrated-circuit chip and the same single face, and being connected to the antenna, by an electrical connection, wherein the metallisations are on only the same single side of the insulating substrate, said electrical connection being made via perforations through the insulating substrate or directly on surface metallisations, and wherein the device has a volume or footprint which is substantially smaller than or of the same magnitude as that of the radiofrequency integrated-circuit chip.

2. The smart card module according to claim 1, wherein the antenna comprises a spiral including antenna turns at the periphery of the substrate, and wherein the chip and the device are arranged inside the spiral.

3. The smart card module according to claim 2, further comprising a metallised redirection terminal inside the spiral, said metallised redirection terminal being connected to the antenna by an electrical connection in the sectioned or un-short-circuited state.

4. The smart card module according to claim 3, wherein said sectioned or un-short-circuited state is the result of one operation among a mechanical or laser ablation, an isolated perforation of the substrate and a link connecting said metallised redirection terminal and said antenna, a mechanical abrasion or a punching.

5. The smart card module according to claim 2, wherein the chip and the device are connected to a single pair of interconnection terminals arranged inside the spiral.

6. The smart card module according to claim 5, further including an outer terminal of the antenna brought close to one of the interconnection terminals via a deflection of the turns, said deflection extending from the periphery of the substrate to the inside of the spiral.

7. The smart card module according to claim 1, wherein the device is a capacitance.

8. The smart card module according to claim 1, wherein the device and the radiofrequency integrated-circuit chip are coated with the same single coating material.

9. A smart card including the smart card module according to claim 1.

10. The smart card according to claim 9, comprising a body with a cavity opening onto the surface and said module inset and secured in the cavity.

11. The smart card of claim 1, wherein the same single face of the substrate is on the same single side of the substrate.

12. The smart card of claim 1, wherein the same single face of the substrate is not on the same single side of the substrate.

13. A module with an integrated-circuit chip, comprising:
an insulating substrate,
metallisations comprising conductive tracks, made on the same single side of the substrate, forming an antenna and comprising two connection ends,
an area for coating or placing the radiofrequency integrated-circuit chip and a device in the form of a surface-mounted device,
the radiofrequency integrated-circuit chip and the device being arranged on the same single face of the substrate, without metallisations between the radiofrequency integrated-circuit chip and the same single face, and being connected to the antenna, by an electrical connection,
wherein the metallisations are on only the same single side of the insulating substrate, said electrical connection being made via perforations through the insulating substrate or directly on surface metallisations.

14. A product comprising a portable body supporting the module of claim 13.

15. The product of claim 14, wherein the portable body is a garment.

16. The product of claim 14, wherein the portable body is a bracelet.

17. The product of claim 14, wherein the portable body is a watch.

18. The product of claim 14, wherein the portable body is a belt.

19. The product of claim 14, wherein the portable body is a key fob.

* * * * *